United States Patent
Melanson

(10) Patent No.: US 7,092,476 B1
(45) Date of Patent: Aug. 15, 2006

(54) DIRECT SYNTHESIS CLOCK GENERATION CIRCUITS AND METHODS

(75) Inventor: John Lawrence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 760 days.

(21) Appl. No.: 10/010,819

(22) Filed: Dec. 6, 2001

(51) Int. Cl.
*H03D 3/24* (2006.01)

(52) U.S. Cl. .................. 375/376; 375/373; 341/144; 341/147; 708/271

(58) Field of Classification Search ............... 375/376, 375/327, 150, 146, 373, 294, 215; 341/143, 341/147, 150, 141, 61, 144; 327/105, 156; 708/271

See application file for complete search history.

(56) References Cited

U.S. PATENT DOCUMENTS

| | | | | |
|---|---|---|---|---|
| 4,951,004 A | * | 8/1990 | Sheffer et al. | 331/1 A |
| 5,563,535 A | * | 10/1996 | Corry et al. | 327/105 |
| 5,859,605 A | * | 1/1999 | Raghavan et al. | 341/143 |
| 5,931,891 A | * | 8/1999 | Landry | 708/271 |
| 6,075,474 A | * | 6/2000 | Gabet et al. | 341/143 |
| 6,483,388 B1 | * | 11/2002 | Khan | 331/18 |
| 6,515,526 B1 | * | 2/2003 | Dairi | 327/156 |

* cited by examiner

*Primary Examiner*—Kevin Burd
*Assistant Examiner*—Ted M. Wang
(74) *Attorney, Agent, or Firm*—James J. Murphy; Thompson & Knight LLP

(57) ABSTRACT

A clock generator includes input circuitry for receiving an input signal and generating a memory address therefrom. A memory stores digital data indexed by the memory address which represents at least a portion of an analog clock. A digital to analog converter converts data retrieved from the memory to generate the analog clock which is then filtered by a filter and then converted into digital output clock.

4 Claims, 3 Drawing Sheets

US 7,092,476 B1

DIRECT SYNTHESIS CLOCK GENERATION CIRCUITS AND METHODS

FIELD OF INVENTION

The present invention relates in general to mixed signal circuitry, and in particular to direct synthesis clock generation circuits and methods.

BACKGROUND OF INVENTION

Often high functionality digital processing devices include multiple processing engines operating in response to clock signals of different frequencies. In other words, the speed of the clocks mediating the operation of various circuit blocks and other on-chip operational units may differ, depending on the function being implemented. These various clocks typically should be synchronous, especially when correlated data, such as audio and video, are being processed.

Traditional PLL techniques allow for the generation of multiple clock frequencies with relatively simple relationships. However, these frequencies are often insufficient to support disparate processing operations. For example, while processing an audio—video data stream, the video is typically processed at a clock frequency substantially higher than that used to process the audio. Moreover, the audio and video clocks may or may not be rationally related. In other words, it may not be possible to easily generate accurate synchronous audio and video clocks by simply dividing-down or multiplying-up a master clock in a PLL or similar circuit.

Additionally, the issue of clock jitter must be addressed. On the one hand, the loop filter cut-off in a conventional PLL should be sufficiently low to reduce reference feedthrough. However, on the other hand, reducing the cut-off frequency of the loop filter increases the VCO noise that falls outside the control of the loop. In other words, some trade-off must normally be made between clock jitter caused by reference clock feedthrough and that caused by VCO noise.

In sum, new techniques are required for generating low-jitter clocks, including clocks of widely varying frequencies and/or frequency varying by non-rational factors.

SUMMARY OF INVENTION

According to one embodiment of the inventive principles, a clock generator is disclosed which includes input circuitry for receiving an input signal and generating a memory address therefrom. A memory stores digital data indexed by the memory address which represents at least a portion of an analog clock. A digital to analog converter converts data retrieved from the memory to generate the analog clock which is then filtered by an associated filter to reduce jitter. The analog clock is then converted to a digital output clock.

Clock generation circuits and methods embodying the present inventive principles offer substantial advantages over the prior art. Among other things, the final output clock has substantially reduced jitter. Additionally, the problem of reference clock feedthrough is also substantially reduced or eliminated. Moreover, the various clock generation circuits disclosed can be integrated into a chip or other device relatively easily and inexpensively.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–8 of the drawings, in which like numbers designate like parts.

Figure 1:
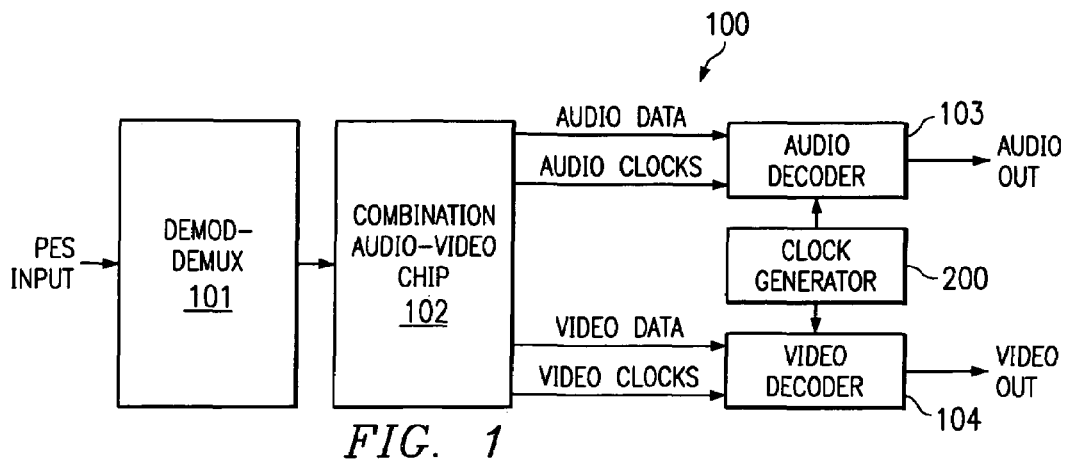
FIG. 1 is a high level functional block diagram of an exemplary audio—video system suitable to describing the present principles.

An exemplary broadcast system 100 suitable for demonstrating the application of the present inventive principles is shown in FIG. 1. In this case data are received from a transmission device, such as a wireless or cable broadcast station in the form of a transport stream, such as an MPEG2 transport stream. The transport stream is a multiplex of audio, video, system control and programming information. The audio and video data, for example, could be multiplexed into the transport stream as Packetized Elementary Streams (PES).

At the receiver, the data are extracted from the given carrier signal by a demodulator—demultiplexer 101. Audio-Video Combination 102 chip splits out the compressed audio and video PES streams which are respectively sent to the audio and video decoders 103 and 104.

Audio and video decoders 103 and 104 preferably operate in response to one or more clock generators 200 discussed in detail below. Advantageously, clock generators 200 provide low-jitter clocks with minimal reference feedthrough across the wide range of clock frequencies needed for both the audio and video processing operations.

Figure 2:
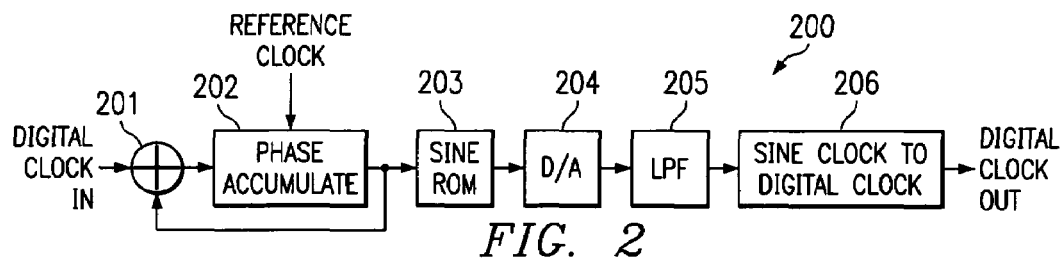
FIG. 2 is a high level block diagram of a first clock generator embodying the principles of the present invention.

FIG. 2 is a high level functional block diagram of a selected clock generator 200 according to one embodiment of the present principles. The input digital frequency is summed in summer (digital adder) 201 with the output of a digital phase accumulator 202. Phase accumulator 202 generates an index to Sine ROM 203 from the current phase at the reference clock rate. In other words, the input clock frequency is summed with feedback from the output of a j-bit wide phase accumulator which steps by a corresponding phase angle step in response to the reference clock from an initial value to a maximum value of $2^j$ and then wraps around to the initial value to generate a modulo-$2^j$ output at a frequency:

$$f_{out} = f_{ref} * f_{in}/2^j$$

Figure 3:
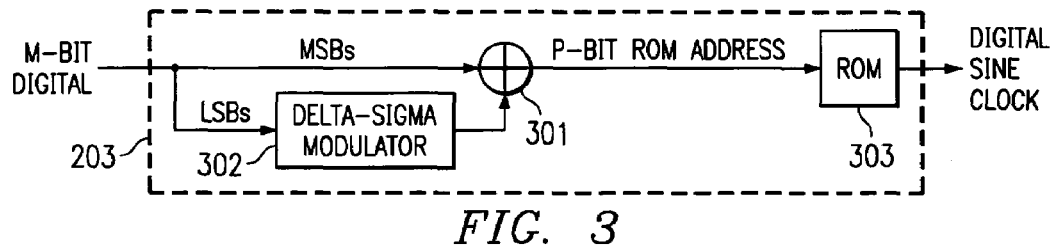
FIG. 3 is a more detailed functional block diagram of the read-only memory shown in FIG. 2 and related indexing circuitry.

Sine (or cosine) ROM 203 stores a set of digital values approximating an analog sinewave clock signal; one particular embodiment is shown in FIG. 3. In the FIG. 3 embodiment, the MSBs of the m-bit wide output from the phase detector are summed in a digital adder 301 with associated LSBs after noise shaping. The noise shaping function can be implemented, for example with a delta-sigma noise shaper (modulator) 302 which translates the noise to a higher out-of-band frequency and, through requantization, reduces the number of bits required to address ROM 303 (and consequently the ROM size itself). If the input for example is 16-bits, the index to Sine (cosine) ROM 303 could be partitioned into 8 MSBs and 8 LSBs, with an 8-bit noise-shaper 302 and an 8-bit adder 301 used to generate 8-bit ROM addresses. The stored sinewave data may also be folded to reduce the amount of memory capacity required.

The digital sine (cosine) clock from the ROM is then passed through a digital to analog (D/A) converter 204 and the resulting analog signal low pass or bandpass filtered by filter 205. The filtering on the sine clock is targeted to reduce the jitter in the ultimate output clock by passing the sine wave and blocking noise. There are a number of ways to implement the D/A conversion and low pass filtering; examples of preferred techniques are discussed below.

The output digital clock at the new clock frequency is then generated in circuit block 206 from the analog sinewave. This can be done with a simple comparator or with a phase-locked loop or similar circuit.

Clock generator 200 has substantial advantages. Among other things, it is relatively simple to integrate in an integrated circuit or system and eliminates or substantially reduces the problem of reference feed through. Additionally, clock generator 200 has a "fast lock" where the reset of the final digital frequency is almost instantaneous. Consequently, filter 205 and the backend circuitry of block 206 can be very fast.

Consider for example an input signal (clock) of 1.5 MHz and a nominal reference clock of 24 MHz driving a final output PLL. Assuming that sine clock periods corresponding to frequencies in the range of 1.5 to 3 MHz are stored in ROM and that a final PLL multiplier of 8 is used, then a final output in the range of 12–24 MHz can be generated relatively easily.

Figure 4:
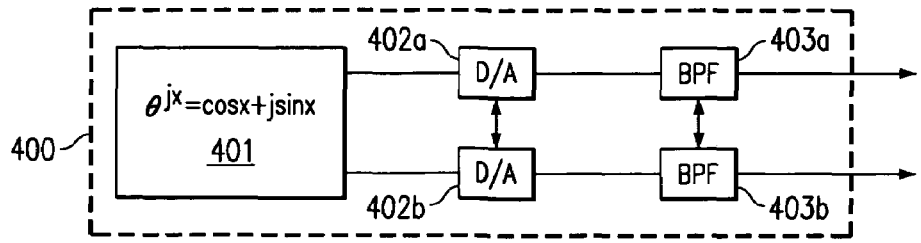
FIG. 4 shows an alternate to the ROM, digital to analog converter and filter configuration shown in FIG. 2 in which complex waveforms are used to generate the final output clock signal.

In an alternate embodiment, sine or cosine ROM 203, D/A converter 205 and low pass filter 206 are replaced with the complex-domain circuit block 400 shown in FIG. 4. In this case, digital data representing points along one or more periods of a complex exponential waveform, are stored in a sine and cosine ROM 401 as real (cos(x)) and imaginary (sin(x)) parts. The data may also be "folded" such that only data from a portion of the sinewave is stored and then used to reconstruct the full period of the sinewave. The addressed data are then converted to analog form and low pass or bandpass filtered by cross-coupled D/A converters 402a,b and cross-coupled bandpass filters 403a,b. The real and imaginary parts allow for the generation of in-phase (I) and quadrature (Q) clocks, which can be used to double or quadruple the output clock frequency.

As indicated briefly above, there are a number of different ways that the D/A conversion stages 204 and 402 can be implemented. For example, assuming an embodiment operating on a complex digital signal having real and imaginary parts, a pair of traditional bandpass delta-sigma modulators could be used. However, this approach adds complexity to the circuit, especially if tuning is required.

Figure 5:
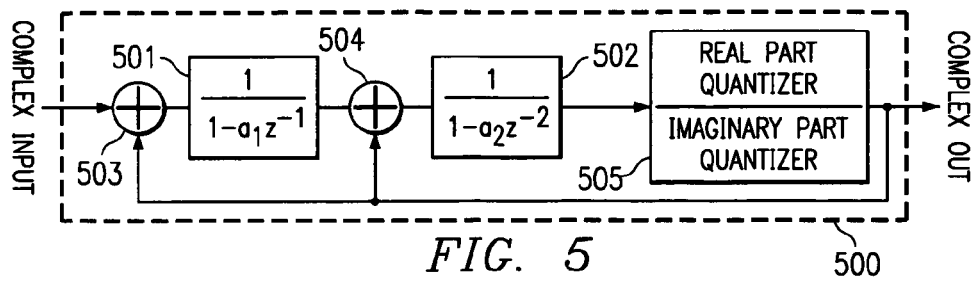
FIG. 5 is a functional block diagram of a second order delta-sigma modulator suitable for use in the digital to analog converters of FIG. 4.
Figure 6:
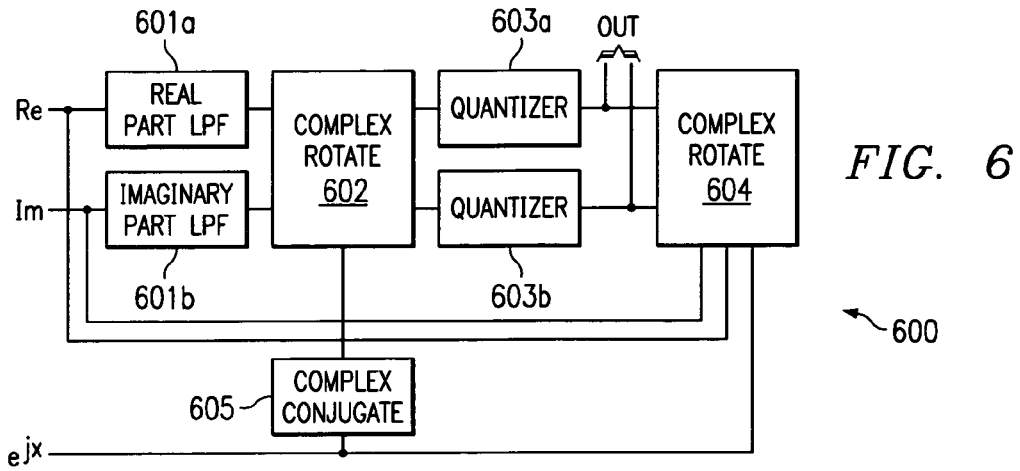
FIG. 6 is a functional block diagram of a tuned quantizer digital to analog converter suitable for use in the embodiment of FIG. 4.

A second approach is illustrated in FIG. 5. In this case, a second order complex delta-sigma modulator 500 includes first and second complex filter stages 501 and 502. The complex modulator quantizer 505 correspondingly includes circuits for quantizing the real and imaginary parts of the signal output from integrator stages 502. Summers 503 and 504 support feedback to the filter stages with complex feedback coefficients a1 and a2, as selected to set the zero of the transfer function of the delta-sigma modulator. These coefficients allow the modulator zeros to be arbitrarily set along the unit circle at the desired sine frequency. The resulting output spectrum then has zeroes at the sine frequency A third, and preferred D/A conversion technique is through tunable complex quantizer 600 shown in FIG. 6. Here, the real and imaginary parts output from complex ROM 401 are low pass filtered by low pass filters 601a,b respectively. Filters 601a,b can be of a simple design, such as those based on a second order delta-sigma modulator.

The filtered versions of the real and imaginary data are then rotated by complex rotator 602 by a phase angle factor. Rotator 602 is preferably a complex multiplier which allows the noise shaping function of the D/A conversion to track the center frequency of the clock being generated. Rotator 602 could be, for example, based on a look-up table in ROM storing real and imaginary rotated parts. For example, the 3 MSBs of each of the real and imaginary parts could be concatenated with a 6-bit phase angle to produce addresses to the ROM. Rotator 602, as well as rotator 604, can also be constructed from a combination of ROM, adders and multiplexers.

The real and imaginary output from the first rotator (602) are then highly quantized by quantizers 603. For example, the quantizer outputs could be quantized in 1 to 3 bits. Advantageously, this coarse quantization allows the rotator look-up table to be relatively simple. For the case of a complex signal, the quantizer outputs are then bandpass filtered, as discussed further below.

A second complex rotator 604 is provided in the feedback loop to bring the output signal back into phase with the input. Rotator 604 correspondingly outputs data at the full accuracy of the input signals, although the input to rotator is coarsely quantized. The phase angle factors applied by rotators 602 and 604 correspond to complex conjugates under control of circuit block 605.

Backend BFPs 403 reduce noise from the synthesized analog sine and cosine signals to control jitter in the final output clock. In the preferred embodiment, at least the final stages of these filters are continuous time filters. Using continuous time filters constructed from tunable transconductances and capacitors is one approach. These filters can be based on one or more cascaded resonators such as resonator 700 shown in FIG. 7A. Resonator 700 includes cross-coupled real and imaginary paths based on tunable transconductances 701–703, capacitors 704 and amplifiers 705. In this example, if the center frequency being generated is f, then.

$$2\pi f = g_{m3}/C \text{ then} \quad (1)$$

$$g_{m1} = g_{m2} = g_{m3}/Q, \quad (2)$$

where a resonator Q of 5–20 will be sufficient for filters using 1–3 resonator stages 700.

Figure 7A:
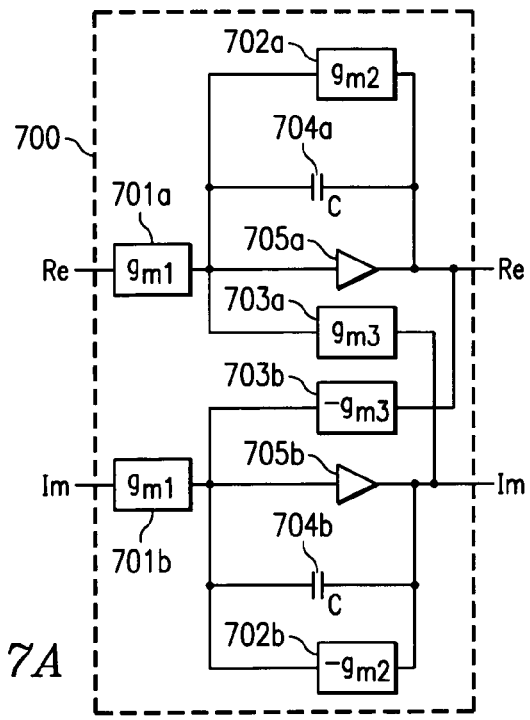
FIG. 7A is a functional block diagram of a resonator circuit suitable for use in constructing continuous time filters for stages in the bandpass filters shown in FIG. 4.
Figure 7B:
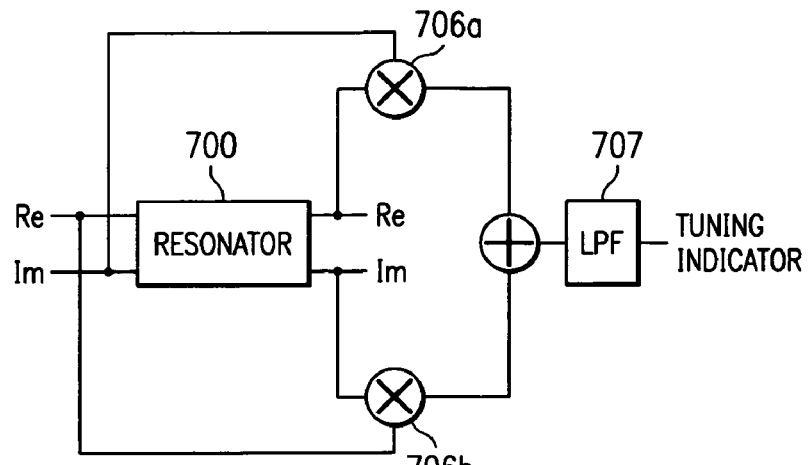
FIG. 7B is a functional block diagram of one possible technique for tuning the resonator shown in FIG. 7A.

FIG. 7B illustrates one technique for tuning the tunable conductances of resonator 700. Here, the output of cross-coupled multipliers 706a,b will only have a DC component when resonator 700 is out of tune. A low pass filter 707 is then used to extract this DC component to generate a tuning indicator signal for adjusting one or more of the tunable transconductances of the resonator.

Figure 8:
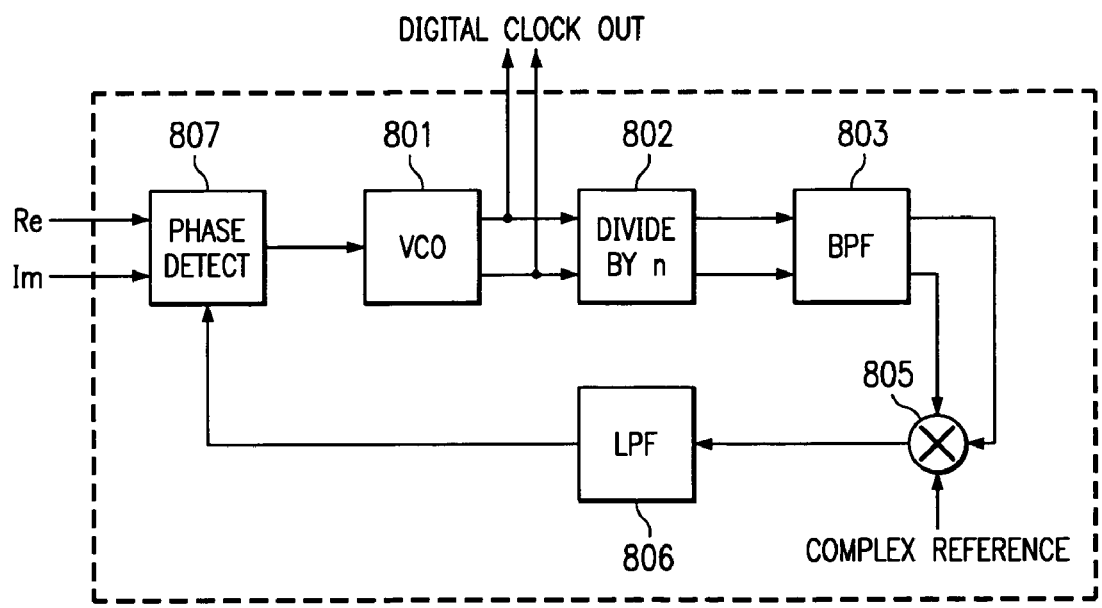
FIG. 8 is a functional block diagram of one possible phase-locked loop for generating the final output clock from the output of the generator circuitry of FIG. 4.

FIG. 8 shows one possible embodiment of a back-end phase-locked loop 800 suitable for generating the final digital clock in block 206 from the filtered analog signal. Here, the output from voltage controlled oscillator (VCO) 801 is divided in block 802 by a divisor n (e.g. 4, 8, 10, and so on) to generate a "gray code" of two out 90-degree out of phase digital clocks forming a complex clock signal. The complex clock signal is optionally filtered by bandpass filter (BPF) 803 and then convolved by a complex reference signal by multiplier 805 and filtered by low pass filter 806. The result is a low frequency that is feedback to front-end phase (frequency) detector 807 at the voltage control input to VCO 801, where it is compared against the real and imaginary parts of the synthesized analog clock waveform. The final output digital clock has only a small amount of additional noise from the convolution. More importantly, there is little, if any, reference feed-through.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A clock signal generator comprising:
    a phase detector for comparing a digital input clock signal with a reference signal to generate a digital phase detection signal;
    circuitry for generating a memory index from said digital phase detection signal;
    a memory storing digital data representing real and imaginary parts of a digital complex waveform accessible by said memory index;
    a digital to analog converter for converting digital data accessed from said memory into an analog complex waveform, the digital to analog converter comprising:
    low pass filters for filtering said real and imaginary parts of said digital complex waveform;
        a rotator for rotating said real and imaginary parts of said digital complex waveform by a selected angle such that a noise shaping function of said digital to analog converter tracks a center frequency of said digital output clock; and
        quantizers for generating said real and imaginary parts of said analog complex waveform from rotated real and imaginary parts output from said rotator;
    bandpass filters for filtering the analog complex waveform to reduce jitter in a binary clock signal derived therefrom; and
    a phase locked loop for generating the binary clock signal from said analog complex waveform and a complex reference signal, wherein the binary clock signal has a rate near an integer multiple of a rate of said analog complex waveform.

2. The clock signal generator of claim 1 wherein said digital to analog converter further comprises a feedback loop including a second rotator for feeding back a rotated output of said quantizer to inputs of said low pass filters.

3. The clock signal generator of claim 1 wherein said bandpass filters each comprise at least one continuous time filter stage.

4. The clock signal generator of claim 3 wherein said continuous time filter stages comprises at least one resonator including at least one variable transconductance.

* * * * *

UNITED STATES PATENT AND TRADEMARK OFFICE
CERTIFICATE OF CORRECTION

PATENT NO. : 7,092,476 B1 Page 1 of 1
APPLICATION NO. : 10/010819
DATED : August 15, 2006
INVENTOR(S) : John Laurence Melanson It is certified that error appears in the above-identified patent and that said Letters Patent is hereby corrected as shown below:

Title Page item 75 in the inventor's name "Lawrence" should be --Laurence--.

Signed and Sealed this

Nineteenth Day of February, 2008

JON W. DUDAS
*Director of the United States Patent and Trademark Office*